(12) United States Patent
Malinen (10) Patent No.: US 11,970,774 B2
(45) Date of Patent: Apr. 30, 2024

(54) METHOD OF OPERATING A DEPOSITION OR CLEANING APPARATUS

(71) Applicant: Picosun Oy, Espoo (FI)

(72) Inventor: Timo Malinen, Espoo (FI)

(73) Assignee: Picosun Oy, Espoo (FI)

( * ) Notice: Subject to any disclaimer, the term of this patent is extended or adjusted under 35 U.S.C. 154(b) by 0 days.

(21) Appl. No.: 18/163,315

(22) Filed: Feb. 2, 2023

(65) Prior Publication Data
US 2023/0193461 A1 Jun. 22, 2023

Related U.S. Application Data

(62) Division of application No. 16/481,221, filed as application No. PCT/FI2017/050071 on Feb. 8, 2017, now Pat. No. 11,725,279.

(51) Int. Cl.
*C23C 16/455* (2006.01)
*C23C 16/458* (2006.01)

(52) U.S. Cl.
CPC .. *C23C 16/45546* (2013.01); *C23C 16/45548* (2013.01); *C23C 16/458* (2013.01)

(58) Field of Classification Search
CPC ............. C23C 16/4409; H01L 21/6719; H01L 21/67748
See application file for complete search history.

(56) References Cited

U.S. PATENT DOCUMENTS

2014/0087093 A1* 3/2014 Kilpi ................ C23C 16/45536
118/723 R

* cited by examiner

*Primary Examiner* — Parviz Hassanzadeh
*Assistant Examiner* — Nathan K Ford
(74) *Attorney, Agent, or Firm* — Ziegler IP Law Group (57) ABSTRACT

A deposition or cleaning apparatus comprising an outer vacuum chamber and a reaction chamber inside the outer chamber forming a double chamber structure. The reaction chamber is configured to move between a processing position and a lowered position inside the outer vacuum chamber, the lowered position being for loading one or more substrates into the reaction chamber.

8 Claims, 8 Drawing Sheets

METHOD OF OPERATING A DEPOSITION OR CLEANING APPARATUS

FIELD

The aspects of the disclosed embodiments generally relate to deposition or cleaning apparatuses and their methods of operation. More particularly, but not exclusively, the aspects of the disclosed embodiments relate to substrate processing reactors with movable structures.

BACKGROUND

This section illustrates useful background information without admission of any technique described herein representative of the state of the art.

In conventional deposition or cleaning processes substrates, e.g., wafers, are moved inside vacuum clusters structures. These structures should give minimum or preferably no added particles on the substrates. Any mechanical or moving part above the substrate is a potential particle source which may affect deposition quality. For some applications and dimensions the moving parts in the prior art can no longer provide an acceptable solution.

U.S. Pat. No. 9,095,869 B2 discloses a deposition reactor structure comprising a substrate transfer chamber in between a plasma source and a reaction chamber. The transfer chamber comprises a moving in-feed part for reactive chemical on the top side of the reaction chamber. The in-feed part is vertically deformable having a contracted shape and an extended shape. The contracted shape allows loading of substrates into the reaction chamber via a route formed by contracting the in-feed part.

SUMMARY

It is an object of embodiments of the present disclosure to provide an improved method and apparatus with regard to loading and unloading of substrates and to minimize or avoid the problem caused by particle generation.

According to a first example aspect of the present disclosure there is provided a deposition or cleaning apparatus, comprising:
an outer chamber;
a reaction chamber inside the outer chamber forming a double chamber structure, wherein the reaction chamber is configured to move between a processing position and a lowered position inside the outer chamber, the lowered position being for loading one or more substrates into the reaction chamber.

Contrary to prior art in which the reaction chamber is stationary and other structures are moved, the embodiments of the invention provide movement of the reaction chamber itself. The reaction chamber is movable in vertical direction, or at least partially in a vertical direction. The reaction chamber being movable includes also a sidewall of the reaction chamber being movable. In certain example embodiments, the movable reaction chamber is a monolithic structure. In certain example embodiments, the reaction chamber forms an integral whole. In certain example embodiments, the movement of the reaction chamber is actuated from below (of the reaction chamber).

In certain example embodiments, the moving parts of the reaction chamber are positioned under the substrate (i.e., not above). In certain example embodiments, the reaction chamber as a whole is configured to move. In certain example embodiments, the side wall of the reaction chamber is configured to move together with the rest of the reaction chamber. In certain example embodiments, the distance between a reaction chamber bottom and reaction chamber side wall is constant while moving. In certain example embodiments, the outer chamber does not move, i.e., the outer chamber is stationary.

The processing position may be a deposition position and/or a cleaning position.

In certain example embodiments, the apparatus is configured to form a loading opening into the reaction chamber by downward movement of the reaction chamber.

In certain example embodiments, the reaction chamber is configured to detach from an upper stationary part (i.e., a stationary part upper to the moving reaction chamber) upon downward movement of the reaction chamber to open a route for loading. In certain example embodiments, the upper stationary part is a part providing fluid in-feed into the reaction chamber.

The part on top of the movable reaction chamber (i.e., upper stationary part of the apparatus) may be an open or closed part. It may be a wide tube, for example, a radical in-feed part extending from a radical source. Or, it may be, for example, a lid-like part optionally comprising an expansion volume for downward fluid distribution.

In certain example embodiments, the reaction chamber forms a body with rotational symmetry. The reaction chamber may be a bowl-like part (having an exhaust opening in its bottom).

In certain example embodiments, the apparatus comprises:
a loading port at the side of the outer chamber for loading the one or more substrates into the reaction chamber through the side of the outer chamber. In certain example embodiments, the loading port is a load lock. In certain example embodiments, the loading port is a gate valve or a hatch.

In certain example embodiments, the apparatus comprises:
a moving element configured to allow vertical movement of the reaction chamber. In certain example embodiments, the moving element is connected to the reaction chamber. The moving element may be a flexure structure. The moving element may be a gastight structure.

In certain example embodiments, the moving element forms part of an exhaust line of the apparatus. The exhaust line may be a foreline. In certain example embodiments, the reaction chamber comprises an exhaust line opening in the bottom of the reaction chamber. In certain example embodiments, the reaction chamber comprises an exhaust line opening symmetrically in the center of the bottom of the reaction chamber. In certain example embodiments, the moving element is placed symmetrically below the bottom of the reaction chamber. In certain example embodiments, the moving element is placed, when viewed in a lateral direction, at the center below the bottom of the reaction chamber.

In certain example embodiments, the moving element is a tube-like elongated structure whose length is adjustable. Accordingly, in certain example embodiments, the moving element is a hollow deformable element. In certain example embodiments, it allows fluid to pass through it in a vertical direction, but has gastight sidewalls.

In certain example embodiments, the moving element is a bellows. In certain example embodiments, the moving element is a vacuum bellows. In certain example embodiments, the moving element (vacuum bellows or similar) is in vacuum in its entirety.

In certain example embodiments, the moving element is implemented by two (or more) interlaced or nested tubes which are vertically movable in relation to each other.

In certain example embodiments, the apparatus comprises an actuating element actuating the vertical movement of the reaction chamber. The actuation may occur by applying force to the reaction chamber so that the reaction chamber moves as allowed by the moving element. The placement of the actuating element depends on the implementation. In certain example embodiments, the actuating element is positioned on the outside of the outer chamber. In certain example embodiments, the actuating element is positioned within the outer chamber, but on the outside of the reaction chamber. In certain example embodiments, the actuating element is positioned within the exhaust line. In certain example embodiment, the actuating element is omitted. In one such an embodiment, the moving element as such moves the reaction chamber without an external actuator (external here meaning external to the moving element). The moving may be implemented due to radiation or changes in temperature, for example. In an example embodiment, the moving element is formed of shape-memory alloy (smart metal) the moving element thereby being an actuator in itself.

In certain example embodiments, the apparatus comprises a substrate holder. The substrate holder may support the substrate, for example, a wafer in a horizontal orientation. In certain example embodiments, the substrate is a 450 mm diameter wafer. In other embodiments, the substrate is a wafer whose diameter is smaller than 450 mm, for example 300 mm. A deposition or cleaning process may be carried out on horizontally oriented substrate(s). Alternatively, the substrate orientation is vertical. The substrate holder may support one vertically oriented substrate or a plurality of vertically oriented substrates. Depending on the implementation, the substrates may be oriented either horizontally or vertically when loading them. The substrates may be loaded one at a time or as a batch.

In certain example embodiments, the substrate holder is attached to the exhaust line. In certain example embodiments, the substrate holder is integratable or integrated to reaction chamber top part of lid. The substrate holder may be movable, for example, vertically. It may be heated and/or otherwise electrically adjustable. In certain other embodiments, the apparatus is implemented without a substrate holder. In such an embodiment, the substrate may be supported by reaction chamber wall(s) and/or by an upper edge of an optional protective element which is placed within the exhaust line and which is configured to prevent material from being deposited on the moving element during processing.

In certain example embodiments, the apparatus comprises:
a heater inside of the outer chamber but on the outside of the reaction chamber.

In certain example embodiments, the apparatus comprises inactive gas in-feed into the outer chamber into an intermediate space formed in between the reaction chamber and outer chamber walls and outlet of the inactive gas from the intermediate space. The intermediate space herein is the volume within the outer chamber that surrounds the reaction chamber. The outer chamber may be formed by a pressure vessel. The outer chamber may be denoted as a vacuum chamber due to vacuum conditions generated therein. In certain example embodiments, both the reaction chamber and outer chamber are in vacuum when loading the substrates (and during processing, i.e., deposition and/or cleaning). In certain example embodiments, the outer chamber and the reaction chamber contain separate walls, i.e., they do not have common walls, but the outer chamber truly accommodates the reaction chamber (being separated by the intermediate space).

In certain example embodiments, an inner surface of the moving element faces an exhaust line pressure. In certain example embodiment, an outer surface of the moving element faces a pressure that is higher than the pressure within the exhaust line. The higher pressure may be a pressure within the intermediate space, or an ambient pressure in some embodiments.

In certain example embodiments, the direction of gas flow within the reaction chamber is from top to bottom. The gas or fluid in-feed into the reaction chamber is preferably from the top side of the reaction chamber and the outlet from a lower part of the reaction chamber (below the substrate), for example, through the bottom or bottom part of the reaction chamber into an exhaust line.

In certain other embodiments, the direction of gas flow within the reaction chamber is completely or partially from side to side, over a horizontally oriented substrate. The gas or fluid in-feed into the reaction chamber in this embodiment is arranged from a side or off-center of the substrate.

In certain example embodiments, the movable reaction chamber encloses a reaction space (in which the desired deposition or cleaning reactions are intended to occur).

In certain example embodiments, the apparatus is an atomic layer deposition, ALD, apparatus. In this context, the term ALD comprises ALD sub-types, such as MLD (Molecular Layer Deposition), plasma-assisted ALD, for example PEALD (Plasma Enhanced Atomic Layer Deposition), and photo-enhanced Atomic Layer Deposition (known also as flash enhanced ALD). In alternative embodiments, the apparatus is a chemical vapor deposition, CVD, apparatus. In alternative embodiments, the apparatus is a plasma-assisted cleaning apparatus.

In certain example embodiments, the apparatus comprises a deformable part above the substrate(s), as in U.S. Pat. No. 9,095,869 B2, enabling listing of a reaction chamber in-feed part. The deformable part may be implemented by a bellows or by interlacing tubes as deformable components.

In certain example embodiments, the pressure within both the reaction chamber and outer chamber (if any) is below ambient or atmospheric pressure, the apparatus therefore being configured to process substrates in such a reduced pressure.

According to a second example aspect of the present disclosure there is provided a method, comprising:
providing a reaction chamber of a deposition or cleaning reactor with a processing position and a lowered position; and
moving the reaction chamber between the processing position and the lowered position, the lowered position being for loading one or more substrates into the reaction chamber.

In certain example embodiments, the method comprises:
forming a loading opening into the reaction chamber by downward movement of the reaction chamber.

In certain example embodiments, the reaction chamber comprises or is formed of a reaction chamber body or a reaction vessel. In certain example embodiments, the method comprises moving the reaction chamber body or reaction vessel as a whole.

In certain example embodiments, the method comprises: detaching the reaction chamber from an upper stationary part upon downward movement of the reaction chamber.

In certain example embodiments, the method comprises: loading the one or more substrates into the reaction chamber through a side of an outer chamber surrounding the reaction chamber.

In certain example embodiments, the method comprises: moving the reaction chamber by a gastight flexure element, such as a vacuum bellows.

In certain example embodiments, the method comprises: moving the reaction chamber by an element positioned into an exhaust line of the deposition or cleaning reactor.

In certain example embodiments, the method comprises providing an intermediate space formed in between the reaction chamber and outer chamber walls with a greater pressure compared to reaction chamber pressure.

In certain example embodiments, the method is implemented in a deposition or cleaning reactor having an outer chamber and a reaction chamber inside the outer chamber.

In certain example embodiments, the method comprises practicing an atomic layer deposition, ALD, method on the one or more substrates within the reaction chamber. In certain alternative embodiments, the method comprises practicing a chemical vapor deposition, CVD, method on the one or more substrates within the reaction chamber. In certain example embodiments, the method comprises practicing a cleaning process, such as a plasma-assisted cleaning process, within the reaction chamber.

According to a third example aspect of the present disclosure there is provided a deposition or cleaning reactor (substrate processing reactor or apparatus) comprising means for implementing the method of the second aspect or any of the embodiments of the second aspect.

Different non-binding example aspects and embodiments of the present invention have been illustrated in the foregoing. The above embodiments are used merely to explain selected aspects or steps that may be utilized in implementations of the present invention. Some embodiments may be presented only with reference to certain example aspects of the invention. It should be appreciated that corresponding embodiments apply to other example aspects as well. Any appropriate combinations of the embodiments may be formed.

BRIEF DESCRIPTION OF THE DRAWINGS

The aspects of the disclosed embodiments will now be described, by way of example only, with reference to the accompanying drawings, in which.

DETAILED DESCRIPTION

In the following description, Atomic Layer Deposition (ALD) technology is used as an example. However, the invention is not limited to ALD technology, but it can be exploited in a wide variety of deposition apparatuses, for example, in Chemical Vapor Deposition (CVD) reactors as well as in cleaning reactors.

The basics of an ALD growth mechanism are known to a skilled person. ALD is a special chemical deposition method based on the sequential introduction of at least two reactive precursor species to at least one substrate. It is to be understood, however, that one of these reactive precursors can be substituted by energy when using photo-enhanced ALD or plasma-assisted ALD, for example PEALD, leading to single precursor ALD processes. Thin films grown by ALD are dense, pinhole free and have uniform thickness.

The at least one substrate is typically exposed to temporally separated precursor pulses in a reaction vessel to deposit material on the substrate surfaces by sequential self-saturating surface reactions. In the context of this application, the term ALD comprises all applicable ALD based techniques and any equivalent or closely related technologies, such as, for example the following ALD sub-types: MLD (Molecular Layer Deposition) plasma-assisted ALD, for example PEALD (Plasma Enhanced Atomic Layer Deposition) and photo-enhanced Atomic Layer Deposition (known also as flash enhanced ALD).

A basic ALD deposition cycle consists of four sequential steps: pulse A, purge A, pulse B and purge B. Pulse A consists of a first precursor vapor and pulse B of another precursor vapor. Inactive gas and a vacuum pump are typically used for purging gaseous reaction by-products and the residual reactant molecules from the reaction space during purge A and purge B. A deposition sequence comprises at least one deposition cycle. Deposition cycles are repeated until the deposition sequence has produced a thin film or coating of desired thickness. Deposition cycles can also be either simpler or more complex. For example, the cycles can include three or more reactant vapor pulses separated by purging steps, or certain purge steps can be omitted. All these deposition cycles form a timed deposition sequence that is controlled by a logic unit or a microprocessor.

Figure 1:
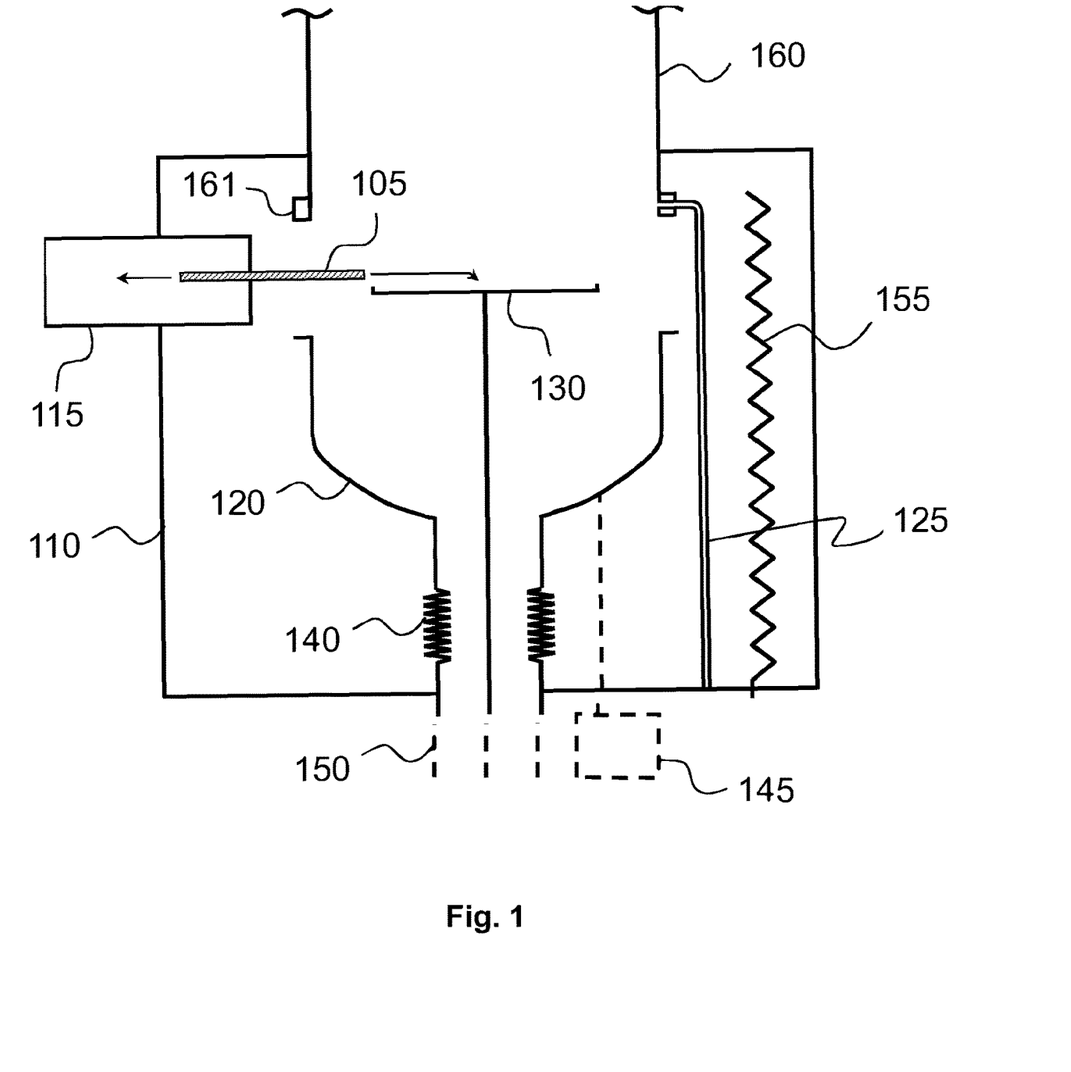
FIG. 1 shows a schematic side view of an apparatus in a loading stage according to an embodiment of the present disclosure.
Figure 2:
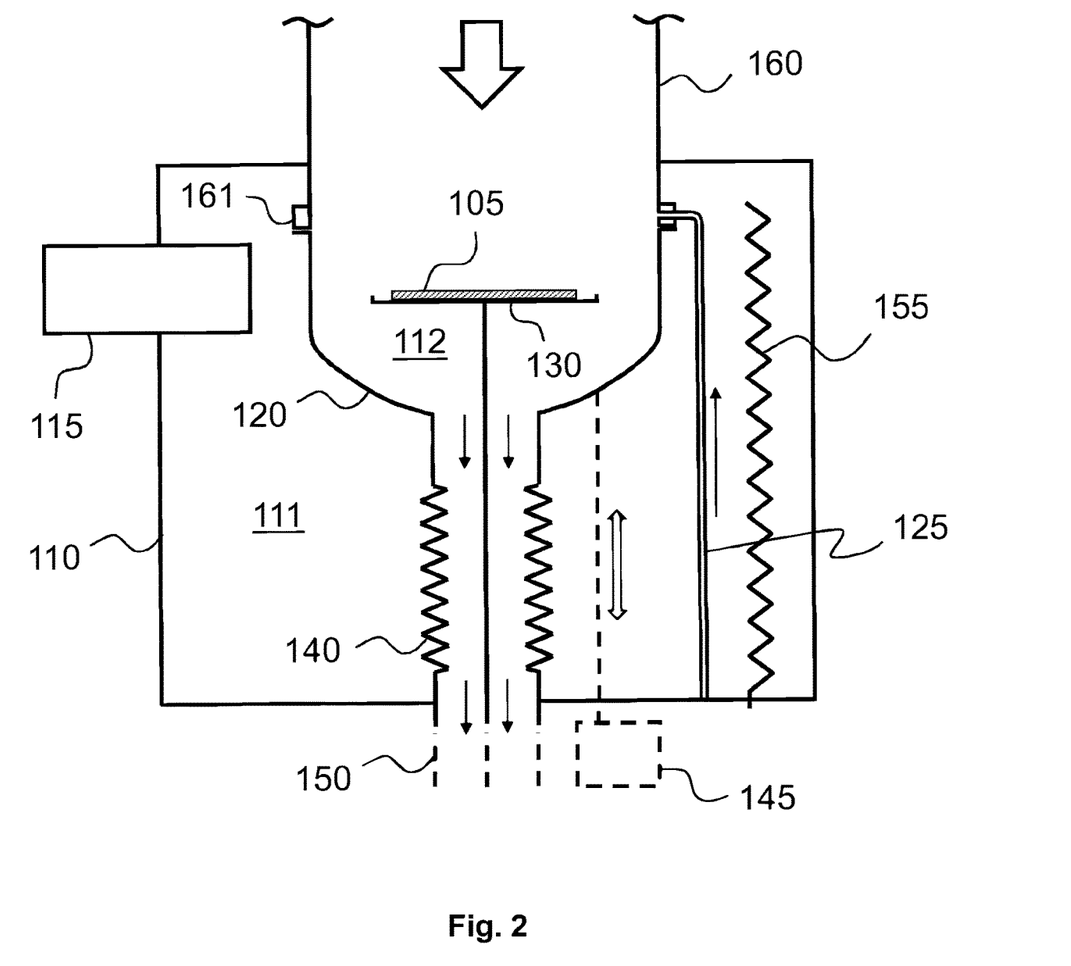
FIG. 2 shows a schematic side view of the apparatus disclosed in FIG. 1 in a processing stage according to an embodiment of the present disclosure.

FIGS. 1 and 2 show schematic side views of a deposition or cleaning apparatus according to an example embodiment. The apparatus comprises an outer chamber wall defining an outer chamber 110. The apparatus further comprises a reaction chamber 120 inside the outer chamber 110 thus forming a double chamber structure. The space formed in between the outer chamber wall and the reaction chamber 120 (i.e., the space defined by the outer chamber 110 and surrounding the reaction chamber 120) is defined as an intermediate space 111 and the space within the reaction chamber 120 as a reaction space 112 as shown in FIG. 2.

The reaction chamber 120 is configured to move between a deposition or cleaning position (FIG. 2) and a lowered position (FIG. 1) inside the outer chamber 110. The lowered position is for loading one or more substrates 105 into the reaction chamber. The deposition or cleaning position is for processing the one or more substrates 105 in accordance with the selected deposition or cleaning method, for example, ALD or CVD.

The apparatus comprises a loading port 115 at the side of the outer chamber 110 for loading the one or more substrates 105 into the reaction chamber 120 through the side of the outer chamber 110. The loading port 115 shown depicts a load lock 115, although in alternative embodiments the load lock 115 may be omitted and replaced by a simpler structure, such as a hatch or similar. In certain example embodiments, the loading port 115 may be a gate valve or a load lock against ambient conditions or against other equipment.

The apparatus comprises a moving element 140 connected to the reaction chamber 120. The moving element 140 allows the reaction chamber 120 to move vertically between the deposition or cleaning position and the lowered position. The moving element 140 may be a flexure structure. It may be a tube-like elongated structure whose length is adjustable. The moving element 140 may be a deformable component. The moving element 140 shown in FIGS. 1 and 2 is a bellows, in particular a vacuum bellows, allowing fluid to pass through in a vertical direction, but having gastight side walls. The moving element 140 may form part of an exhaust line 150 below the reaction chamber 120 as shown in FIGS. 1 and 2. The moving element 140 is positioned in its entirety inside of the outer chamber 110 walls in vacuum.

The actual movement of the reaction chamber 120 may be driven by an actuator (actuating element) or by the moving element 140 itself. The embodiment in FIGS. 1 and 2 shows an actuator 145 positioned on the outside of the outer chamber 110. The actuator 145 applies force to the reaction chamber 120 so that the reaction chamber moves as allowed by the moving element 140. The actuator 145 shown in FIGS. 1 and 2 comprises a force transmission member, such as a shaft or rod, which extends through an outer chamber feedthrough into the intermediate space between the outer chamber 110 and reaction chamber 120. The force transmission member further contacts the reaction chamber 120 enabling movement of the reaction chamber 120 as allowed by the moving element 140. The moving element 140 has a contracted shape as shown in FIG. 1 and an extended shape as shown in FIG. 2, and it allows vertical movement of the reaction chamber 120 between positions defined by these shapes.

In other embodiments, the placement, form and operation of the actuating element may deviate from the ones shown in FIGS. 1 and 2. The placement of the actuating element depends on the implementation. In certain example embodiments, the actuating element is positioned on the outside of the outer chamber. In certain example embodiments, the actuating element is positioned within the outer chamber, but on the outside of the reaction chamber. In certain example embodiments, the actuating element is positioned within the exhaust line 150. Depending on the implementation the deposition or cleaning apparatus can comprise a plurality of actuating elements.

Figure 3:
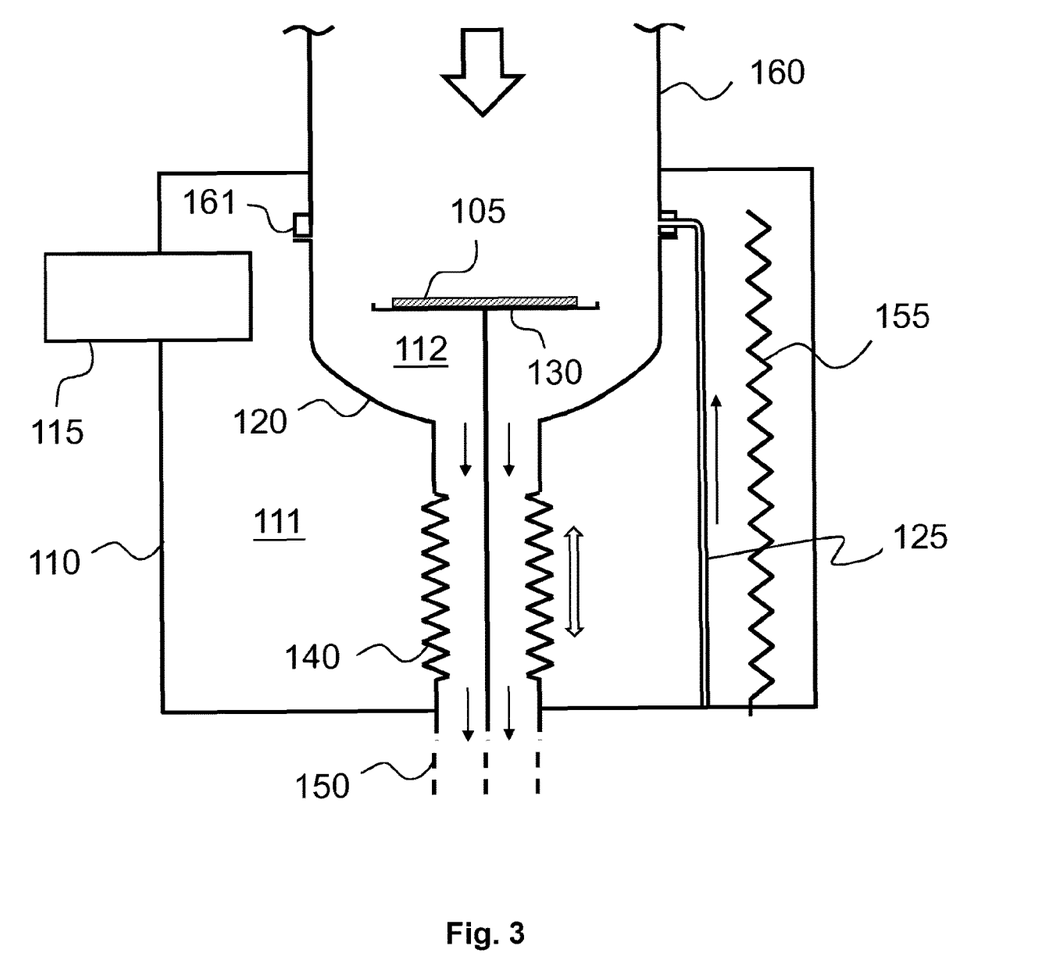
FIG. 3 shows a schematic side view of an apparatus according to an alternative embodiment of the present disclosure.

In certain example embodiment, the actuating element is omitted altogether. In one such an embodiment, the moving element 140 as such moves the reaction chamber without an external actuator (external here meaning external to the moving element). The moving may be implemented due to radiation or changes in temperature, for example. FIG. 3 shows one such alternative embodiment in which the moving element 140 is formed of shape-memory alloy (smart metal). In such an embodiment, the moving element 140 in practice is a kind of actuator in itself which moves the reaction chamber 120 between vertical positions.

The apparatus is configured to form a loading opening into the reaction chamber 120 by downward movement of the reaction chamber 120. Accordingly, in certain example embodiments, the reaction chamber 120 is configured to detach from an upper stationary part upon downward movement of the reaction chamber 120 to open a route for loading. In certain example embodiments, the upper stationary part is a part providing fluid in-feed into the reaction chamber 120.

The part on top of the movable reaction chamber (i.e., upper stationary part of the apparatus) may be an open or closed part.

The embodiment shown in FIGS. 1 and 2 shows a radical in-feed tube 160 extending from a radical source (not shown). The radical in-feed tube remains stationary when the reaction chamber 120 is lowered. The loading opening forms in between the reaction chamber 120 sidewall and the radical in-feed tube 160 (FIG. 1).

The embodiment shown in FIGS. 1 and 2 further shows an in-feed line 125 which may be an in-feed line for inactive gas, or for a precursor of thermal ALD, for example. The in-feed line 125 extends from a source (not shown) via an outer chamber feedthrough into the intermediate space. It further extends into an outlet in a fixed flange or collar 161 on top of the movable reaction chamber 120 (so as to provide entry of inactive/precursor gas or fluid into the reaction chamber 120 at that point). The part 161 remains stationary when the reaction chamber 120 is lowered. Depending on the implementation the deposition or cleaning reactor can comprise a plurality of in-feed lines 125. In other embodiments, for example in certain cleaning embodiments, they can be omitted.

Figure 4:
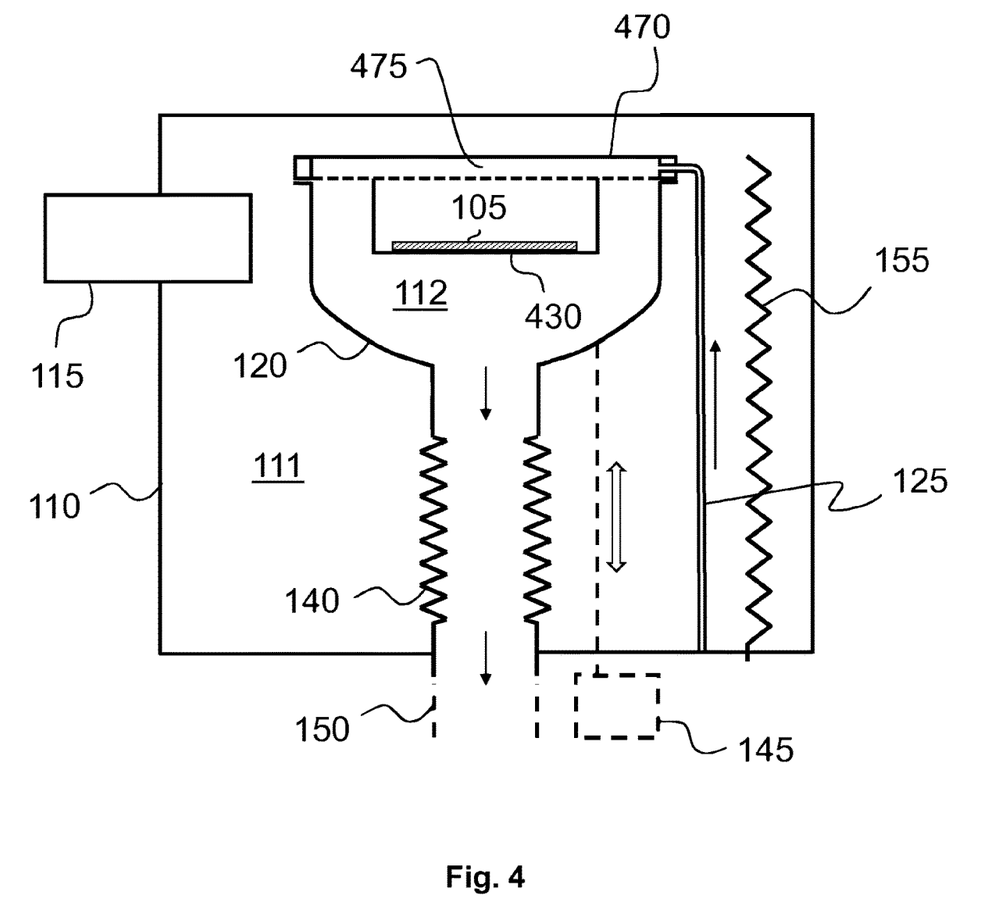
FIG. 4 shows a schematic side view of an apparatus according to yet another embodiment of the present disclosure.

The alternative embodiment shown in FIG. 4 shows an example of a closed upper stationary part. It may be, for example, a lid-like part 470 optionally comprising an expansion volume 475 for downward fluid distribution.

The apparatus comprises a substrate holder 130 which is configured to receive the one or more substrates 105 loaded through the loading port 115. In certain example embodiments, the substrate holder 130 is attached to the exhaust line 150. In certain other example embodiments, such as the one shown in FIG. 4, a substrate holder 430 is integratable or integrated to reaction chamber top part of lid 470. The substrate holder may be movable within the reaction chamber 120, for example, vertically.

The apparatus described herein also comprises a heater 155 within the outer chamber 110 but on the outside of the reaction chamber 120, although in some embodiments the heater may be omitted.

Figure 5:
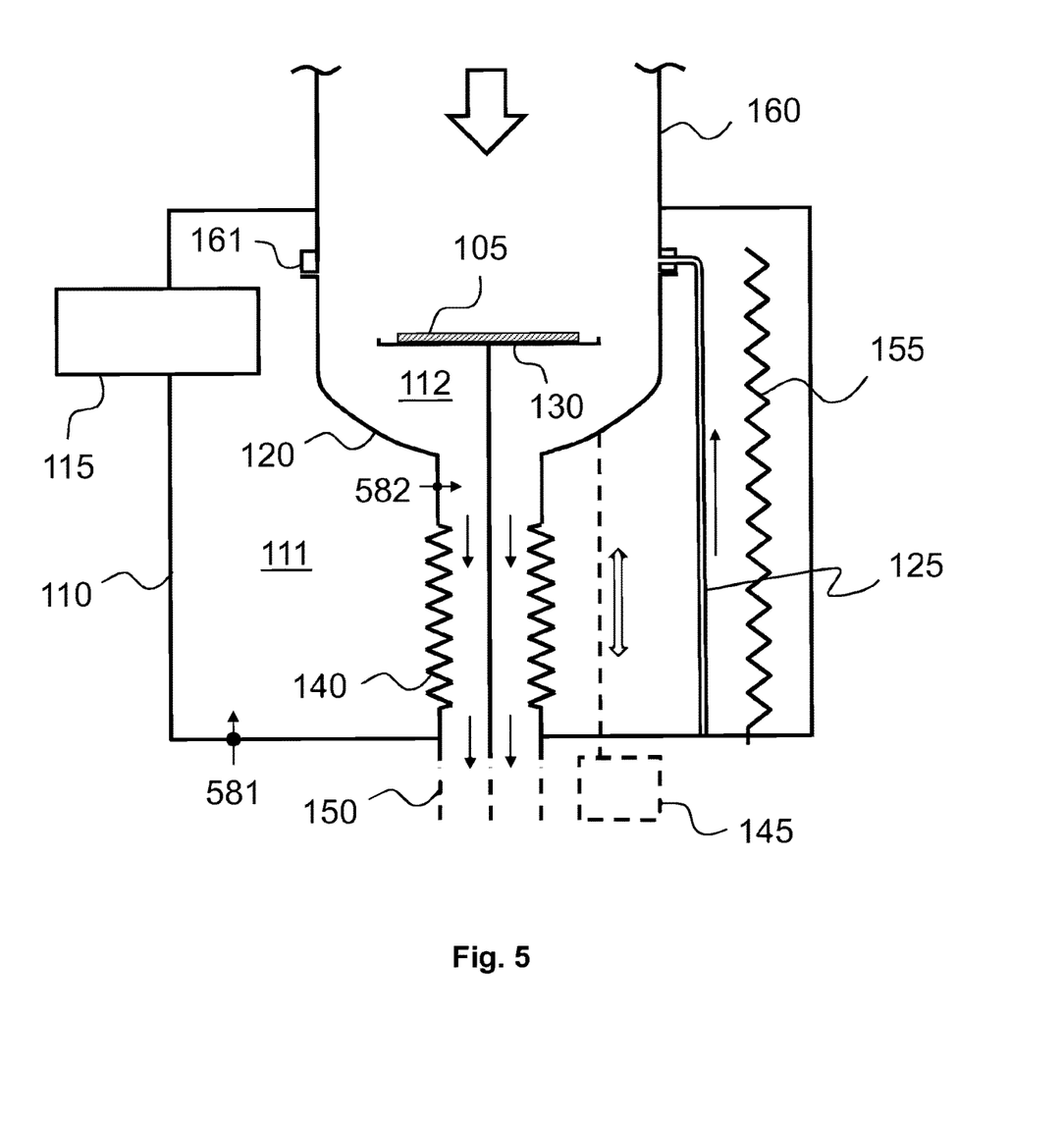
FIG. 5 shows certain details in an apparatus according to an embodiment of the present disclosure.

In certain example embodiments, the apparatus comprises inactive gas in-feed into the outer chamber 110 into the intermediate space formed in between the reaction chamber 120 and outer chamber 110 walls and outlet of the inactive gas from the intermediate space (the intermediate space herein being the volume within the outer chamber that surrounds the reaction chamber). FIG. 5 shows one such an embodiment. Inactive gas is fed in via an outer chamber feedthrough 581 and pumped out to the exhaust line 150 via feedthrough 582. The outlet can be upstream or downstream in relation to the moving part 140. In an alternative embodiment, the outlet is to a separate pump line. In a yet alternative embodiment, the outlet is into the reaction chamber 120 at the point where the moving reaction chamber 120 contacts the upper stationary part. The contact formed between the movable reaction chamber 120 and the stationary part when the reaction chamber 120 is in the deposition or cleaning position may be a metal-metal contact.

In certain example embodiments, the direction of gas flow within the reaction chamber 120 is from top to bottom. The gas or fluid in-feed into the reaction chamber 120 is preferably from the top side of the reaction chamber 120 and the outlet from a lower part of the reaction chamber (below the substrate), for example, through the bottom or bottom part of the reaction chamber 120 into the exhaust line 150. In the end of the exhaust line 150 is a vacuum pump (not shown) which pumps the interior of the reaction chamber 120 into vacuum.

In certain example embodiments, the reaction chamber 120 forms a body with rotational symmetry. The reaction chamber 120 may be a bowl-like part (having an exhaust opening in its bottom). The outer chamber 110 may be formed by a pressure vessel. The outer chamber 110 may be denoted as a vacuum chamber due to vacuum conditions generated therein. In certain example embodiments, both the reaction chamber 120 and outer chamber 110 are in vacuum when loading the substrates (and during processing). The outer chamber 110 walls form a borderline. The volume within the vacuum chamber walls, which especially applies to the interior of the reaction chamber 120, is pumped into vacuum by a vacuum pump (not shown) vacuum conditions thereby prevailing within the volume defined by the vacuum chamber walls.

In certain example embodiments, the pressure in the intermediate space 111 during processing is below atmospheric pressure. In certain example embodiments the pressure in the intermediate space is 0.9 bar or less, preferably 15-5 mbar the pressure in the reaction space 112 then preferably being 1.5-0.1 mbar. The pressure in the intermediate space 111 is preferably at least two times the pressure in the reaction space 112. In some embodiments, the pressure in the intermediate space 111 is 5 to 10 times the pressure in the reaction space 112. In some other embodiments, such as when using microwave plasma, the pressure in the reaction space 112 may be 1 Pa and the pressure in the intermediate space 4-5 Pa. A turbomolecular pump may be applied to obtain high degrees of vacuum.

When the reaction chamber 120 is opened (lowered) for unloading the pressure of the reaction chamber 120 in an embodiment is raised to a reading that is the same of higher compared to the pressure in the intermediate space 111 so as to push possible particles away from the substrate.

Figure 6:
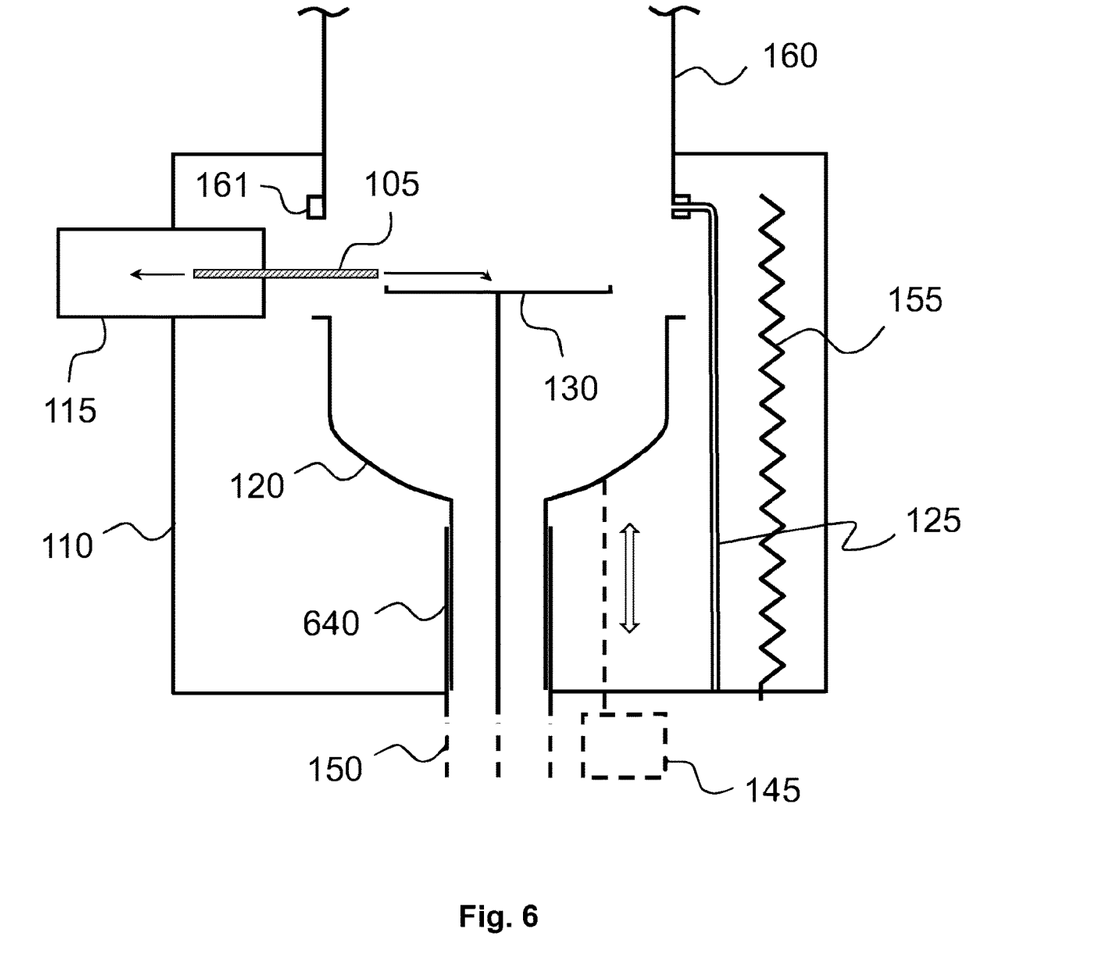
FIG. 6 shows a schematic side view of an apparatus according to another alternative embodiment of the present disclosure.

In certain example embodiments, an alternative moving element is used. The moving element 640 shown in FIG. 6 is implemented by two (or more) interlaced or nested tubes which are vertically movable in relation to each other. The embodiment otherwise contains similar elements and operates similarly as the embodiments described in the preceding.

Figure 7:
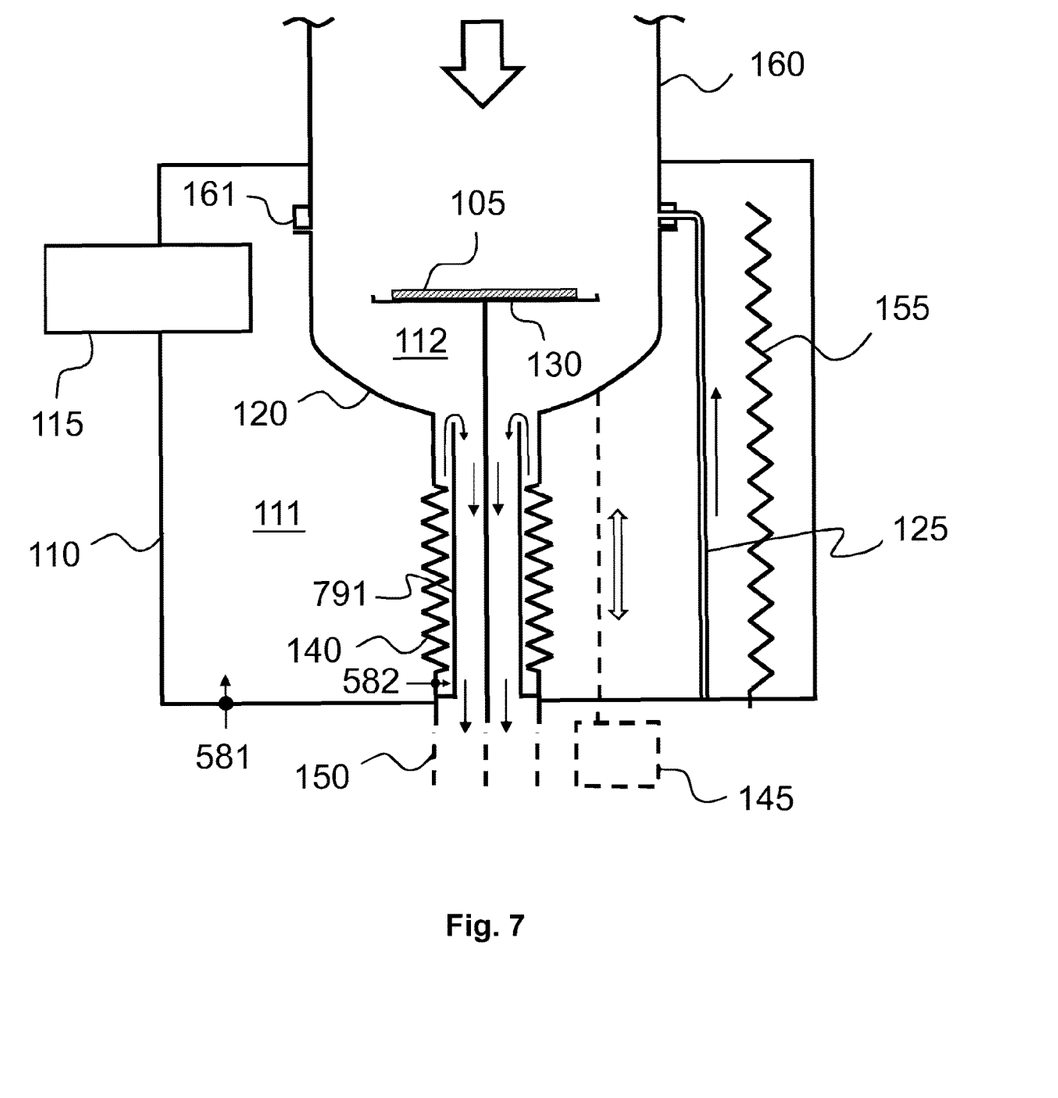
FIG. 7 shows a schematic side view of an apparatus according to yet another alternative embodiment of the present disclosure.

FIG. 7 shows an optional protective element 791 which is placed within the exhaust line 150 and which is configured to prevent material from being deposited on the moving element 140 during processing. The protective element 791 may be in the form of a tube and it may extend along the whole length of the moving element 140, and even further. It may be fixed to the exhaust line 150 or to an edge of the outer chamber 110. Inactive gas is in an embodiment fed from the intermediate space 111 into the space formed in between the protective element 791 and the moving element 140 via feedthrough 582 close to a dead lower end of the space. The inactive gas flows upwards along the formed tight space to the point in which the protective element 791 ends. The flow turns there into the downward direction and mixes with exhaust line flow. The entry of reactive gases into the space in between the protective element 791 and the moving element 140 is thereby hindered. In embodiments where the substrate holder 130 is omitted the substrate(s) may be supported by an upper edge of the protective element 791.

In yet another embodiment, there is a second moving element (another tubular element such as a second bellows) around the disclosed (first) moving element 140. A closed space is formed in between the two moving elements and the formed space is pressurized with gas or fluid as required to obtain deformations in the moving elements due to changes in applied pressure thereby causing vertical movement of the reaction chamber 120 as desired. Said second moving element may be for example tightly fitted against the outer wall of the reaction chamber 120 at its one end and against the outer chamber 110 wall at its other end. The arrangement operates as a pneumatic actuator.

In yet another embodiment, the outer chamber 110 is omitted. The reaction chamber 120 forms part of a single chamber reactor. A loading opening is formed by lowering the reaction chamber 120 as a whole.

Figure 8:
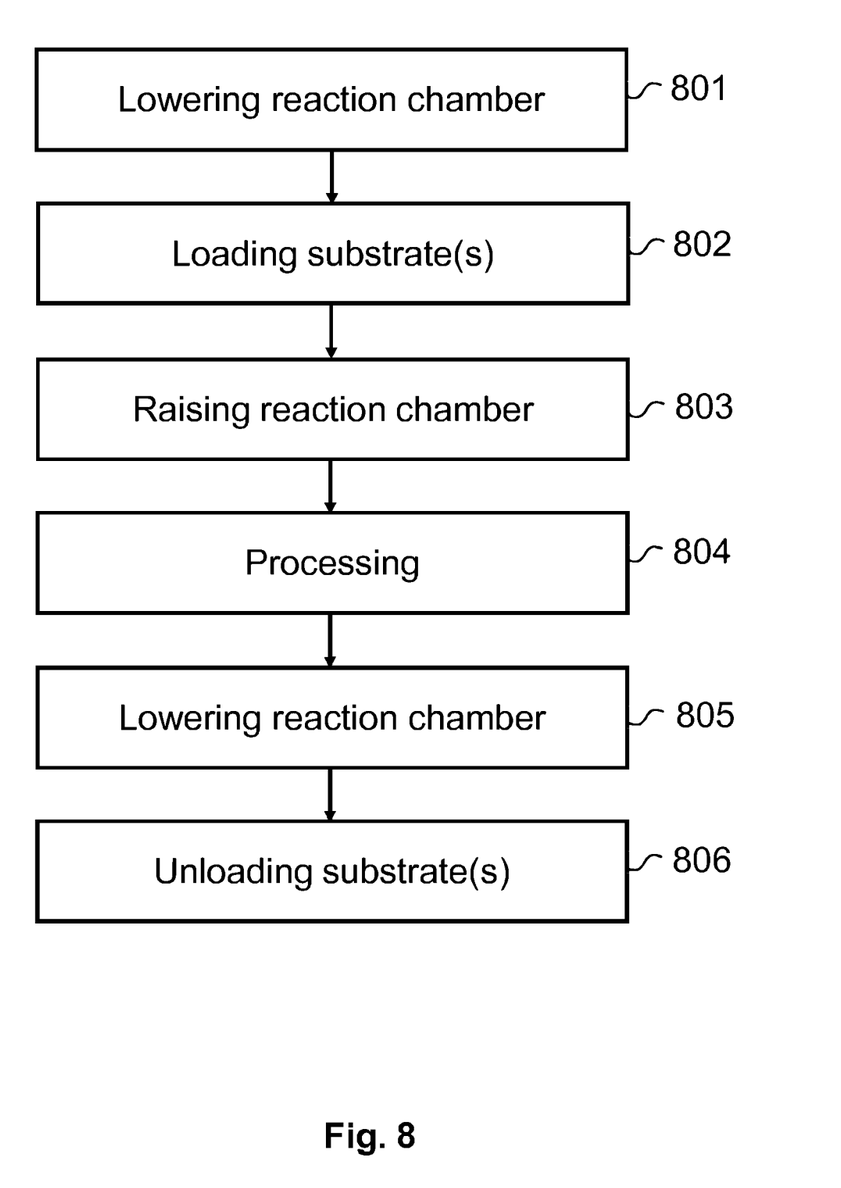
FIG. 8 shows a method according to an embodiment of the present disclosure.

FIG. 8 shows a method according to an embodiment of the present disclosure. In step 801, the reaction chamber is lowered. The one or more substrates is loading in step 802. The reaction chamber is raised into the deposition or cleaning position in step 803 for the deposition and/or cleaning to occur with a selected deposition or cleaning method in step 804. After processing, the reaction chamber is again lowered in step 805, and the one or more substrates are unloaded in step 806. In more general embodiments, one or more of the steps 802-806 may be omitted. In yet another embodiment, for example in a powder coating embodiment, the powder may be loaded along a separate channel and unloaded along the same or different channel. In such an embodiment, the lowering of the reaction chamber for loading will not be needed, but the lowering of the reaction chamber may be used for a maintenance purpose only.

The description concerning any particular preceding embodiment is directly applicable to other disclosed embodiments. This applies both with regard to the structure and operation of the disclosed apparatus.

Without limiting the scope and interpretation of the patent claims, certain technical effects of one or more of the example embodiments disclosed herein are listed in the following. A technical effect is reduced particle formation in a substrate processing apparatus, such as a deposition or cleaning apparatus, above the substrate surface by placing the moving parts of the reaction chamber below the substrate. Another technical effect is preventing particles from below the substrate from entering the space above the substrate, when the flow direction below the substrate is further away from the substrate (i.e., downwards). Another technical effect is improved loading method in a substrate processing reactor, in a double chamber substrate processing reactor in particular. Another technical effect is yet increased pressure difference, which can be obtained by using flexible bellows a deformable component, compared referred state of are.

It should be noted that some of the functions or method steps discussed in the preceding may be performed in a different order and/or concurrently with each other. Furthermore, one or more of the above-described functions or method steps may be optional or may be combined.

The foregoing description has provided by way of non-limiting examples of particular implementations and embodiments of the present disclosure a full and informative description of the best mode presently contemplated by the inventors for carrying out the invention. It is however clear to a person skilled in the art that the present disclosure is not restricted to details of the embodiments presented above, but that it can be implemented in other embodiments using equivalent means without deviating from the characteristics of the present disclosure.

Furthermore, some of the features of the above-disclosed embodiments of the present disclosure may be used to advantage without the corresponding use of other features. As such, the foregoing description should be considered as merely illustrative of the principles of the present disclosure, and not in limitation thereof. Hence, the scope of the present disclosure is only restricted by the appended patent claims.

What is claims is:

1. A method, comprising:
    providing a deposition or cleaning apparatus with a reaction chamber inside an outer chamber forming a double chamber structure, the reaction chamber having a processing position and a lowered position;
    providing a substrate holder; and
    moving the reaction chamber vertically between the processing position and the lowered position by an exhaust line comprising a bellows connected between the reaction chamber and the outer chamber, the lowered position being for loading one or more substrates onto the substrate holder at a substrate loading level, and the exhaust line being positioned below the reaction chamber,
    wherein the reaction chamber moves below the substrate loading level at the loading position to above both the substrate loading level and above the substrate holder at the processing position,
    wherein a length of the bellows of the exhaust line changes when the reaction chamber is moved vertically, and
    wherein the exhaust line has gastight sidewalls and allows fluid from the reaction chamber to pass through the exhaust line.

2. The method of claim 1, comprising:
    forming a loading opening into the reaction chamber by downward movement of the reaction chamber and a vertically extending sidewall.

3. The method of claim 1, comprising:
    detaching the reaction chamber from an upper stationary part upon downward movement of the reaction chamber and a vertically extending sidewall.

4. The method of claim 1, comprising:
    loading the one or more substrates into the reaction chamber through a side of the outer chamber surrounding the reaction chamber.

5. The method of claim 1, wherein the bellows is flexible.

6. The method of claim 1, comprising: providing an intermediate space formed in between the reaction chamber and outer chamber walls with a greater pressure compared to reaction chamber pressure.

7. The method of claim 1, comprising: practicing an atomic layer deposition (ALD) method on the one or more substrates within the reaction chamber.

8. The method of claim 1, wherein the bellows comprises a vacuum bellows.

* * * * *